(12) United States Patent
Norimoto

(10) Patent No.: US 11,114,342 B2
(45) Date of Patent: Sep. 7, 2021

(54) WAFER PROCESSING METHOD

(71) Applicant: DISCO CORPORATION, Tokyo (JP)

(72) Inventor: Ryuji Norimoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 36 days.

(21) Appl. No.: 16/166,316

(22) Filed: Oct. 22, 2018

(65) Prior Publication Data
US 2019/0122928 A1    Apr. 25, 2019

(30) Foreign Application Priority Data

Oct. 23, 2017    (JP) .............................. JP2017-204690

(51) Int. Cl.

| | |
|---|---|
| H01L 21/67 | (2006.01) |
| H01L 21/78 | (2006.01) |
| H01L 21/3065 | (2006.01) |
| H01L 21/683 | (2006.01) |
| H01L 21/304 | (2006.01) |
| H01L 21/268 | (2006.01) |
| H01L 21/027 | (2006.01) |

(52) U.S. Cl.
CPC .......... *H01L 21/78* (2013.01); *H01L 21/0273* (2013.01); *H01L 21/268* (2013.01); *H01L 21/304* (2013.01); *H01L 21/3065* (2013.01); *H01L 21/6836* (2013.01); *H01L 2221/6834* (2013.01); *H01L 2221/68327* (2013.01)

(58) Field of Classification Search
CPC ..................................................... H01L 21/78
See application file for complete search history.

(56) References Cited

U.S. PATENT DOCUMENTS

| | | | | |
|---|---|---|---|---|
| 2008/0299745 A1* | 12/2008 | Morikazu | ............ | B28D 5/0011 438/463 |
| 2011/0062827 A1* | 3/2011 | Ichikawa | ............. | H03H 9/1035 310/348 |
| 2013/0337633 A1* | 12/2013 | Seddon | ................... | H01L 21/78 438/462 |
| 2014/0141596 A1* | 5/2014 | Matsuzaki | ............. | H01L 21/78 438/462 |

(Continued)

FOREIGN PATENT DOCUMENTS

| | | |
|---|---|---|
| JP | 2006114825 A | 4/2006 |
| JP | 2013055120 A | 3/2013 |
| JP | 2014199833 A | 10/2014 |

*Primary Examiner* — Mohammad M Choudhry
(74) *Attorney, Agent, or Firm* — Greer, Burns & Crain, Ltd.

(57) ABSTRACT

A wafer processing method is a method of dividing a wafer in which a functional layer is laminated to a top surface of a substrate and a plurality of devices are formed, along streets dividing the plurality of devices. The wafer processing method includes: a protective member disposing step of disposing an adhesive tape on the functional layer side of a top surface of the wafer; a cutting step of forming, along the streets, a cut groove having a depth exceeding a finished thickness of the wafer by making a cutting blade cut into an undersurface of the wafer; and a plasma etching step of extending the cut groove toward the top surface of the wafer and dividing the substrate along the streets by plasma-etching, from an undersurface side, the wafer whose adhesive tape side is held by a chuck table.

13 Claims, 13 Drawing Sheets

(56) References Cited

U.S. PATENT DOCUMENTS

| | | | |
|---|---|---|---|
| 2014/0298969 A1* | 10/2014 | Kozai | B26D 7/0616 |
| | | | 83/477.1 |
| 2016/0071767 A1* | 3/2016 | Hashimoto | H01L 33/0095 |
| | | | 257/620 |
| 2016/0254188 A1* | 9/2016 | Priewasser | H01L 21/78 |
| | | | 438/114 |

* cited by examiner

WAFER PROCESSING METHOD

BACKGROUND OF THE INVENTION

Field of the Invention

The present invention relates to a wafer processing method, and particularly to plasma dicing.

Description of the Related Art

Processing methods using a cutting blade and a laser beam are known to be applied to a semiconductor wafer formed of a silicon substrate or the like in order to divide the semiconductor wafer into individual device chips. In these processing methods, a wafer is divided into device chips by processing planned dividing lines (streets) one by one. Progress has been made in reductions in the size, weight, and cost of device chips due to miniaturization of electronic apparatuses in recent years, and a large number of device chips having a small size of 2 mm or less are produced as well as conventional device chips whose size exceeds 10 mm. In a case where small-sized device chips are manufactured, the number of streets per wafer is increased dramatically, and a processing time is lengthened when processing is performed on one line at a time.

Accordingly, a method referred to as plasma dicing has been developed which processes all of the streets of a wafer in a single operation (see, for example, Japanese Patent Laid-Open No. 2006-114825). In the plasma dicing disclosed in Japanese Patent Laid-Open No. 2006-114825, a region other than a region shielded by a mask is removed by plasma etching, and the processing is performed in wafer units. The plasma dicing therefore has an effect of preventing the processing time from being lengthened dramatically even when the number of streets is increased.

However, in order to accurately expose only the region to be removed by etching, the plasma dicing disclosed in Japanese Patent Laid-Open No. 2006-114825 requires preparation of a precise mask conforming to the streets of each wafer (see, for example, Japanese Patent Laid-Open No. 2013-055120 and Japanese Patent Laid-Open No. 2014-199833).

SUMMARY OF THE INVENTION

However, masks disclosed in Japanese Patent Laid-Open No. 2013-055120 and Japanese Patent Laid-Open No. 2014-199833, in particular, involve high cost as compared with cutting processing or the like, and present remaining problems with a high degree of difficulty, such as reductions in manufacturing cost and the number of manufacturing man-hours, the establishment of a technology for alignment of the masks, and the like.

Accordingly, it is an object of the present invention to provide a wafer processing method that makes it possible to perform plasma etching while reducing cost.

In accordance with an aspect of the present invention, there is provided a wafer processing method for dividing a wafer in which a functional layer is laminated to a top surface of a substrate and a plurality of devices are formed, along streets demarcating the plurality of devices, the wafer processing method including: a protective member disposing step of disposing a protective member on the functional layer side of a top surface of the wafer; a cutting step of forming, along the streets, a cut groove having a depth exceeding a finished thickness of the wafer by making a cutting blade cut into an undersurface of the wafer; and a plasma etching step of extending the cut groove toward the top surface of the wafer and dividing the substrate along the streets by plasma-etching, from an undersurface side, the wafer whose protective member side is held by a chuck table.

The wafer processing method may further include a laser processing step of removing the functional layer along the cut groove by irradiating the functional layer remaining at a groove bottom of the cut groove dividing the substrate with a laser beam having a wavelength absorbable by the functional layer after performing the plasma etching step.

In the wafer processing method, after forming a first cut groove in the undersurface of the wafer, in the cutting step, a second cut groove narrower than the first cut groove may be formed at the groove bottom of the first cut groove, so that entry of a plasma etching gas into the cut groove in the plasma etching step is facilitated.

The wafer processing method may further include a finish grinding step of reducing the wafer thickness to the finished thickness by grinding the undersurface of the wafer after the plasma etching step.

The wafer processing method may further include a preliminary grinding step of grinding the undersurface of the wafer in advance before the plasma etching step.

The wafer processing method may further include: a die attachment film affixing step of affixing a die attachment film to the undersurface of the wafer after the plasma etching step; and a die attachment film dividing step of dividing the die attachment film by irradiating the die attachment film with a laser beam along the cut groove.

The wafer processing method according to the invention of the present application produces an effect of making it possible to perform plasma etching while reducing cost.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Modes for carrying out the present invention (embodiments) will be described in detail with reference to the drawings. Contents described in the following embodiments do not limit the present invention. In addition, constituent elements described in the following include constituent elements easily understood by those skilled in the art and substantially identical constituent elements. Further, configurations described in the following can be combined with each other as appropriate. In addition, various omissions, replacements, or changes of configurations can be made without departing from the spirit of the present invention.

First Embodiment

Figure 1:
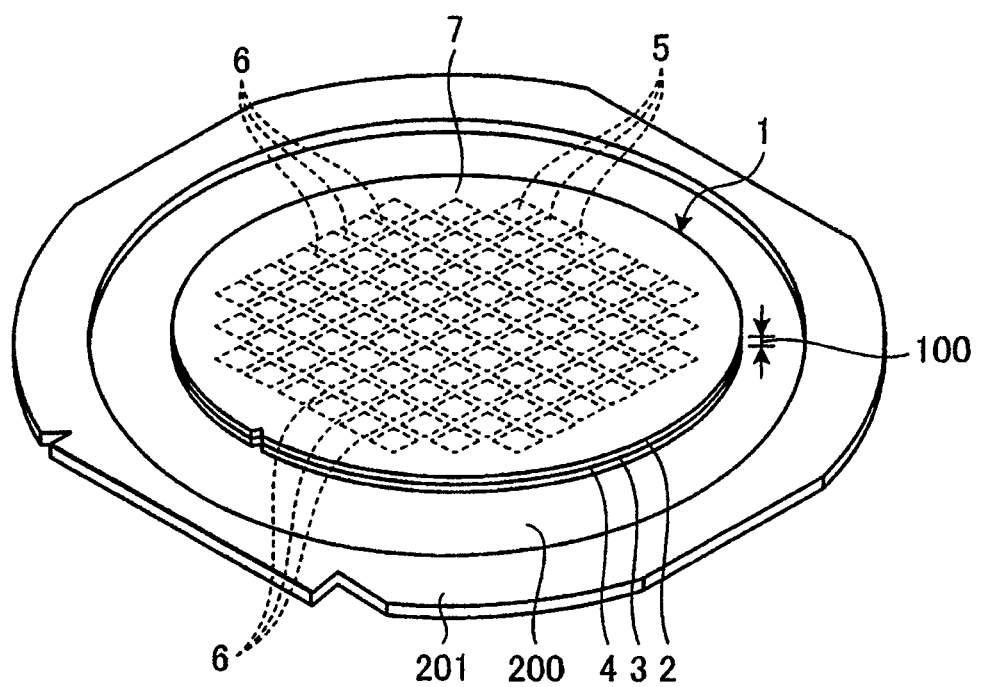
FIG. 1 is a perspective view illustrating an example of a wafer as a processing target of a wafer processing method according to a first embodiment.
Figure 2:
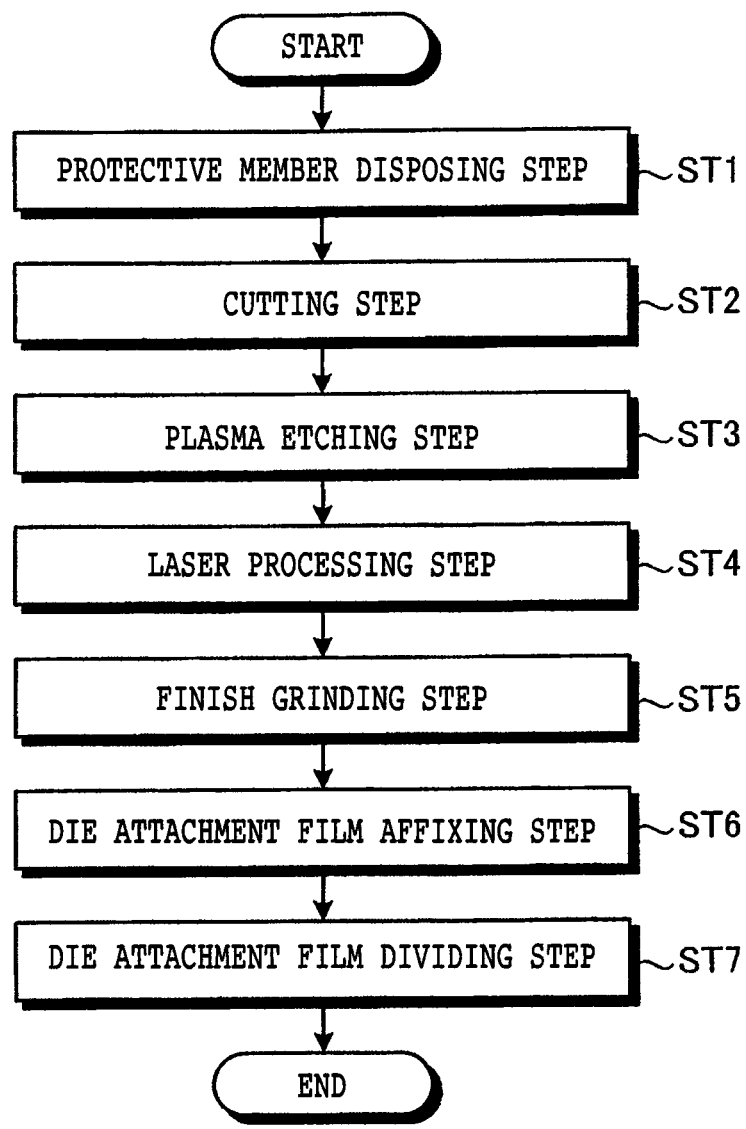
FIG. 2 is a flowchart illustrating a flow of the wafer processing method according to the first embodiment.

A wafer processing method according to a first embodiment of the present invention will be described with reference to the drawings. FIG. 1 is a perspective view illustrating an example of a wafer as a processing target of the wafer processing method according to the first embodiment. FIG. 2 is a flowchart illustrating a flow of the wafer processing method according to the first embodiment.

The wafer processing method according to the first embodiment is a method of processing a wafer 1 illustrated in FIG. 1. In the first embodiment, the wafer 1 is a disk-shaped semiconductor wafer or a disk-shaped optical device wafer having a silicon wafer, a sapphire wafer, a gallium arsenide wafer, or the like as a substrate 2. As illustrated in FIG. 1, the wafer 1 has a functional layer 4 laminated to a top surface 3 of the substrate 2, and has devices 5 formed therein. The functional layer 4 is formed by a low dielectric constant insulator film (Low-k film) formed of an inorganic material-based film of SiOF, BSG (SiOB), or the like or an organic material-based film as a polyimide-based polymer film, a parylene-based polymer film, or the like. The functional layer 4 is laminated to the top surface 3 of the substrate 2.

The devices 5 are formed in respective regions demarcated by a plurality of intersecting streets 6 of the top surface 3. That is, the streets 6 demarcate the devices 5. Some parts of circuits constituting the devices 5 are supported by the functional layer 4. In addition, in at least a part of the streets 6 of the wafer 1, at least one of a metallic film and a TEG (Test Element Group) not illustrated in the figure is formed on the top surface 3 side of the substrate 2. The TEG is an element for an evaluation for finding problems in design or manufacture which problems occur in the devices 5.

The wafer processing method according to the first embodiment is a method of dividing the wafer 1 into device chips including the individual devices 5 along the streets 6, and thinning the device chips to a finished thickness 100. As illustrated in FIG. 2, the wafer processing method includes a protective member disposing step ST1, a cutting step ST2, a plasma etching step ST3, a laser processing step ST4, a finish grinding step ST5, a die attachment film affixing step ST6, and a die attachment film dividing step ST7.

(Protective Member Disposing Step)

The protective member disposing step ST1 is a step of disposing an adhesive tape 200 as a protective member on the functional layer 4 side of the top surface 3 of the substrate 2 of the wafer 1. In the protective member disposing step ST1 of the first embodiment, as illustrated in FIG. 1, the adhesive tape 200 having a larger diameter than the wafer 1 is affixed to the functional layer 4 side, and an annular frame 201 is affixed to an outer peripheral edge of the adhesive tape 200. In the first embodiment, the adhesive tape 200 is used as a protective member. However, in the present invention, the protective member is not limited to the adhesive tape 200. After affixing the adhesive tape 200 to the functional layer 4 side of the wafer 1, the wafer processing method proceeds to the cutting step ST2.

(Cutting Step)

Figure 3:
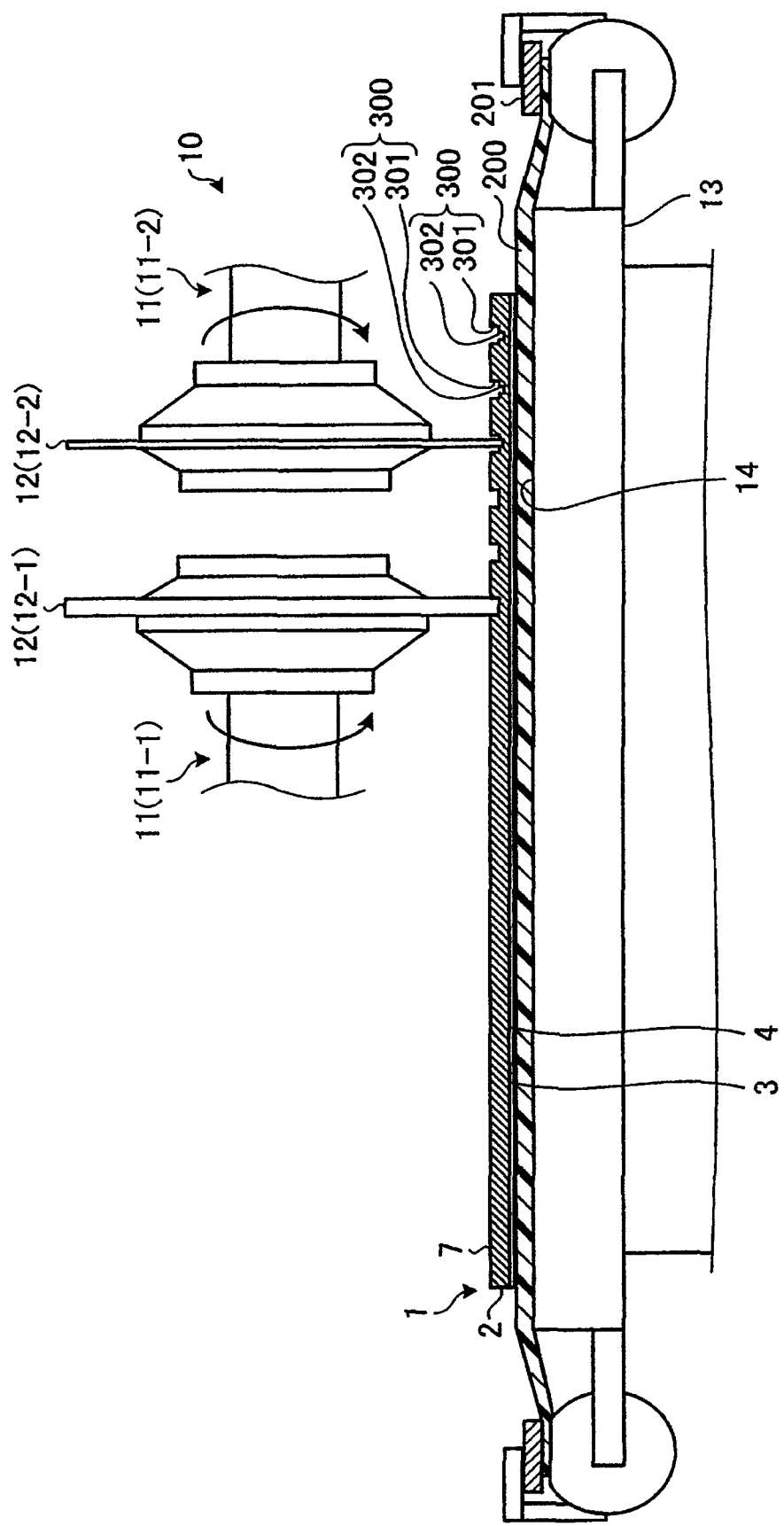
FIG. 3 is a perspective view illustrating a cutting step of the wafer processing method illustrated in FIG. 2.
Figure 4:
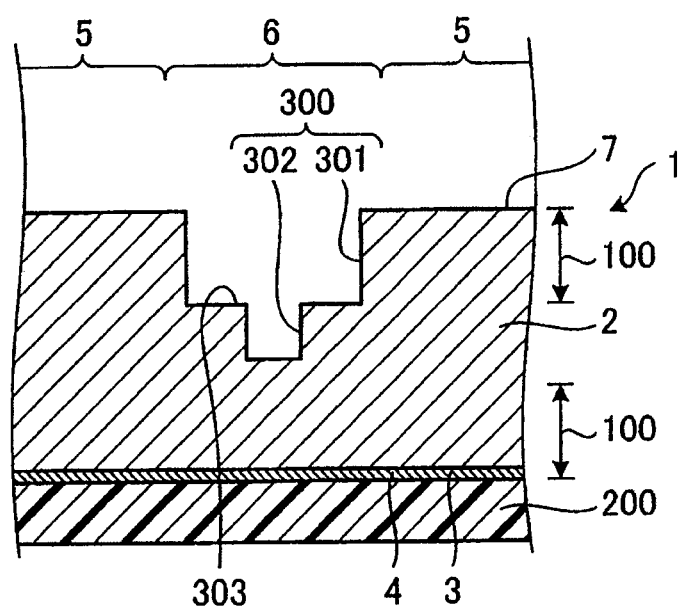
FIG. 4 is a sectional view of a part of the wafer after the cutting step of the wafer processing method illustrated in FIG. 2.

FIG. 3 is a perspective view illustrating the cutting step of the wafer processing method illustrated in FIG. 2. FIG. 4 is a sectional view of a part of the wafer after the cutting step of the wafer processing method illustrated in FIG. 2.

The cutting step ST2 is a step of making cutting blades 12 of a cutting apparatus 10 illustrated in FIG. 3 cut into an undersurface 7 of the substrate 2 of the wafer 1, and thereby forming a cut groove 300 having a depth exceeding the finished thickness 100 of the wafer 1 along the streets 6. In the cutting step ST2 of the first embodiment, as illustrated in FIG. 3, the functional layer 4 side of the wafer 1 is sucked and held, via the adhesive tape 200, onto a holding surface 14 of a chuck table 13 of the cutting apparatus 10 of a so-called facing dual type having two cutting units 11, that is, a dicer with two spindles. In the cutting step ST2, an infrared camera, not illustrated, of the cutting apparatus 10 images the undersurface 7 of the wafer 1, and alignment is carried out which aligns the wafer 1 with the cutting blades 12 of the respective cutting units 11.

In the cutting step ST2, the cut groove 300 is formed on the undersurface 7 side of the wafer 1 by making the cutting blades 12 cut into the undersurface 7 while moving the wafer 1 and the cutting blades 12 of the respective cutting units 11 relative to each other along the streets 6. The thickness of the cutting blade 12 (hereinafter indicated by reference numeral 12-1) of one cutting unit 11 (hereinafter indicated by reference numeral 11-1) of a pair of the cutting unit 11 of the cutting apparatus 10 used in the first embodiment is larger than the thickness of the cutting blade 12 (hereinafter indicated by reference numeral 12-2) of the other cutting unit 11 (hereinafter indicated by reference numeral 11-2). In the cutting step ST2 of the first embodiment, a first cut groove 301 is formed in the undersurface 7 of the wafer 1 by making the cutting blade 12 of the one cutting unit 11 cut into the undersurface 7 by the amount of a finished thickness 100.

In the cutting step ST2, a second cut groove 302 narrower than the first cut groove 301 is formed in a groove bottom 303 of the first cut groove 301 by making the cutting blade 12 of the other cutting unit 11 after the formation of the first cut groove 301 cut into the groove bottom 303 of the first cut groove 301. In the cutting step ST2, the cut groove 300 in the undersurface 7 of the wafer 1 is formed by forming the first cut groove 301 and the second cut groove 302, and thereby entry of plasma formed of a plasma etching gas into the cut groove 300 is facilitated in the plasma etching step ST3. Incidentally, the cut groove 300 in the first embodiment is formed by the first cut groove 301 and the second cut groove 302. After forming the first cut groove 301 and the second cut groove 302 on the undersurface 7 side of all of the streets 6 of the wafer 1 as illustrated in FIG. 4, the wafer processing method proceeds to the plasma etching step ST3.

(Plasma Etching Step)

Figure 5:
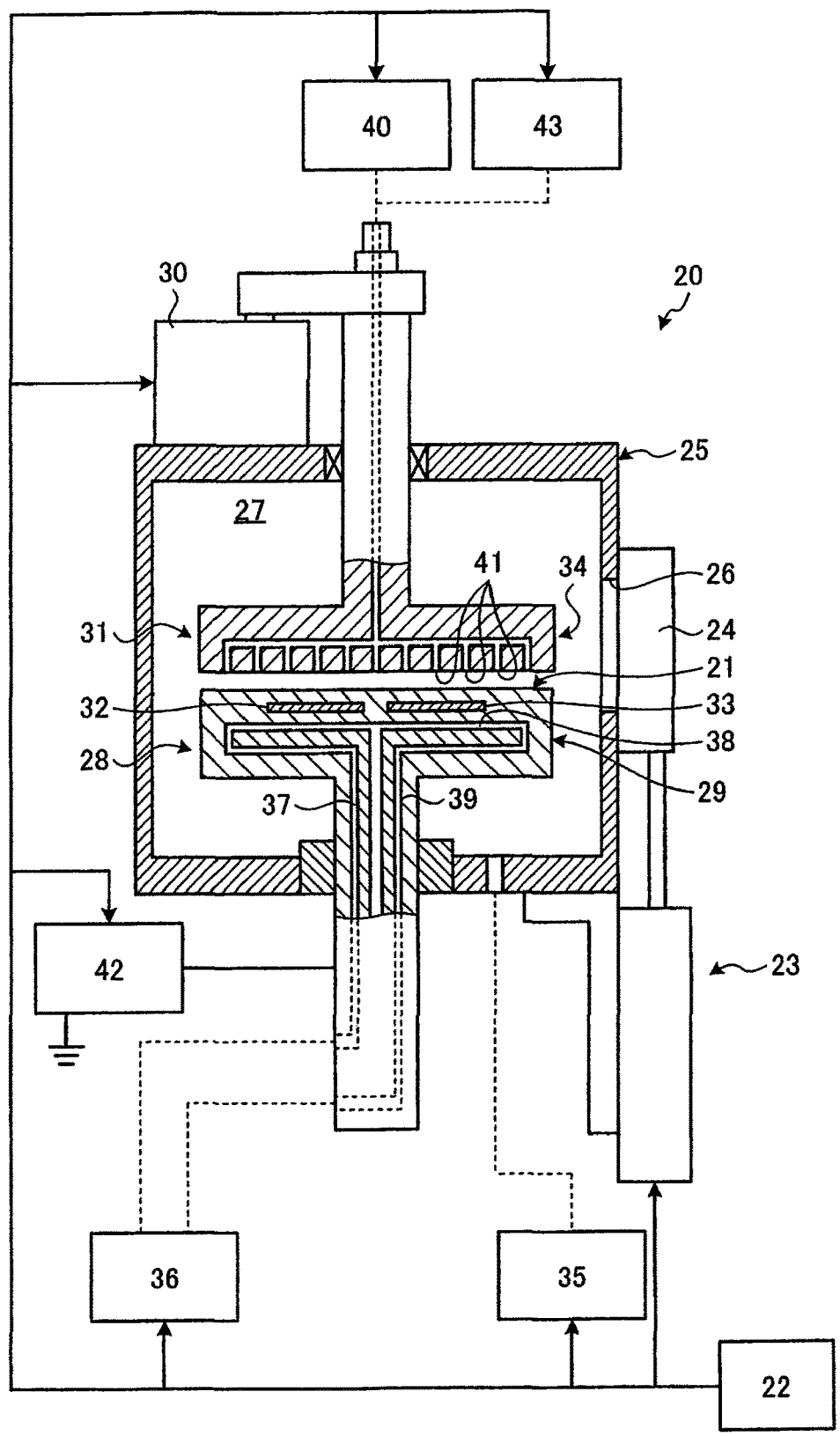
FIG. 5 is a sectional view illustrating a configuration of an etching apparatus used in a plasma etching step of the wafer processing method illustrated in FIG. 2.
Figure 6:
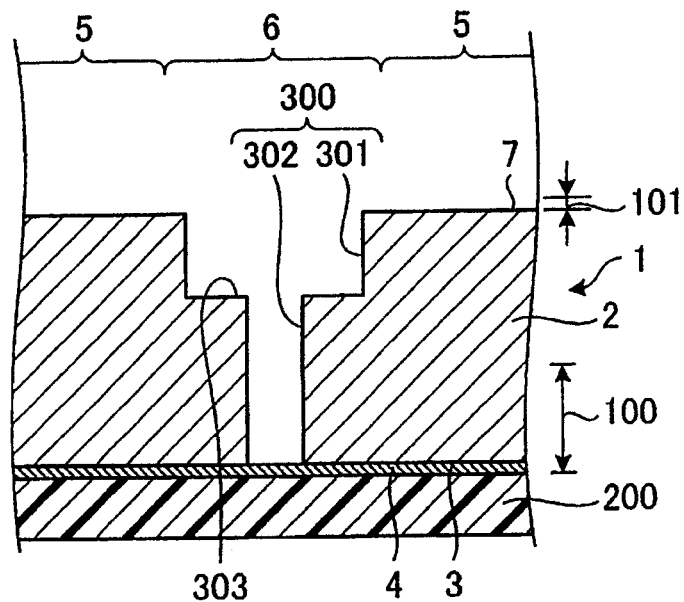
FIG. 6 is a sectional view of a part of the wafer after the plasma etching step of the wafer processing method illustrated in FIG. 2.

FIG. 5 is a sectional view illustrating a configuration of an etching apparatus used in the plasma etching step of the wafer processing method illustrated in FIG. 2. FIG. 6 is a sectional view of a part of the wafer after the plasma etching step of the wafer processing method illustrated in FIG. 2.

The plasma etching step ST3 is a step of dividing the substrate 2 along the streets 6 by extending the cut groove 300 toward the top surface 3 of the substrate 2 of the wafer 1 (making processing progress so as to deepen the cut groove 300 toward the top surface 3 of the substrate 2) through plasma etching of the wafer 1 from the undersurface 7 side, with the adhesive tape 200 side of the wafer 1 held by a chuck table 21 of an etching apparatus 20 illustrated in FIG. 5.

In the plasma etching step ST3, a control unit 22 of the etching apparatus 20 actuates a gate actuating unit 23 to move a gate 24 downward in FIG. 5, and thereby opens an opening 26 of a housing 25. Next, the wafer 1 resulting from the cutting step ST2 is conveyed into a sealed space 27 within the housing 25 through the opening 26 by carrying in/out means not illustrated in the figure, and the functional layer 4 side of the wafer 1 is mounted onto the chuck table 21 (electrostatic chuck, ESC: Electrostatic chuck) of a workpiece holding unit 29 constituting a lower electrode 28 via the adhesive tape 200. At this time, the control unit 22 raises an upper electrode 31 in advance by actuating a raising and lowering driving unit 30. The control unit 22 applies power to electrodes 32 and 33 arranged within the workpiece holding unit 29, and the wafer 1 is sucked and held on the chuck table 21.

The control unit 22 actuates the gate actuating unit 23 to move the gate 24 upward, and thereby closes the opening 26 of the housing 25. The control unit 22 actuates the raising and lowering driving unit 30 to lower the upper electrode 31. The control unit 22 thereby adjusts a distance between an undersurface of a gas jetting portion 34 constituting the upper electrode 31 and the wafer 1 held on the chuck table 21 constituting the lower electrode 28 to a predetermined distance suitable for plasma etching processing.

The control unit 22 actuates a gas discharging unit 35 to vacuum-exhaust the sealed space 27 within the housing 25, thus maintaining the pressure of the sealed space 27 to a predetermined pressure, and actuates a refrigerant supply unit 36 to circulate a helium gas as a refrigerant through a refrigerant introducing passage 37, a cooling passage 38, and a refrigerant discharging passage 39 arranged within the lower electrode 28, thus suppressing an abnormal rise in temperature of the lower electrode 28.

Next, the control unit 22 alternately repeats an etching step of etching the entire undersurface 7 of the wafer 1 and extending the cut groove 300 toward the top surface 3 of the substrate 2 by supplying $SF_6$ in a plasma state to the wafer 1 and a film depositing step of depositing a film on the undersurface 7 of the wafer 1, inner surfaces of the first cut groove 301 and the second cut groove 302, and a groove bottom of the second cut groove 302 by supplying $C_4F_8$ in a plasma state to the wafer 1 after the etching step. Incidentally, the etching step after the film depositing step etches the groove bottom of the second cut groove 302 or the like by isotropic etching using $SF_6$ in a plasma state after removing mainly the film on the groove bottom of the second cut groove 302 by anisotropic etching using $SF_6$ in a plasma state. The plasma etching step ST3 thus plasma-etches the wafer 1 by a so-called Bosch process.

Incidentally, in the etching step, the control unit 22 actuates a $SF_6$ gas supply unit 40 to jet a $SF_6$ gas as a plasma etching gas from a plurality of jetting ports 41 of the upper electrode 31 to the wafer 1 held on the chuck table 21 of the lower electrode 28. Then, in a state in which the $SF_6$ gas for plasma generation is supplied, the control unit 22 applies a high-frequency power for generating and maintaining plasma from a high-frequency power supply 42 to the upper electrode 31, and applies a high-frequency power for drawing in ions from the high-frequency power supply 42 to the lower electrode 28. Thus, plasma formed of the $SF_6$ gas is generated in a space between the lower electrode 28 and the upper electrode 31, and this plasma is drawn into the wafer 1 and etches the undersurface 7 of the wafer 1, the inner surfaces of the first cut groove 301 and the second cut groove 302, and the groove bottom of the second cut groove 302, thus extending the cut groove 300 toward the top surface 3 of the substrate 2.

In addition, in the film depositing step, the control unit 22 actuates a $C_4F_8$ gas supply unit 43 to jet a $C_4F_8$ gas as a plasma etching gas from the plurality of jetting ports 41 of the upper electrode 31 toward the wafer 1 held on the chuck table 21 of the lower electrode 28. Then, in a state in which the $C_4F_8$ gas for plasma generation is supplied, the control unit 22 applies a high-frequency power for generating and maintaining plasma from the high-frequency power supply 42 to the upper electrode 31, and applies a high-frequency power for drawing in ions from the high-frequency power supply 42 to the lower electrode 28. Thus, plasma formed of the $C_4F_8$ gas is generated in the space between the lower electrode 28 and the upper electrode 31, and this plasma is drawn into the wafer 1 and deposits a film on the wafer 1.

The number of times of repetition of the etching step and the film depositing step in the plasma etching step ST3 is set in the control unit 22 in advance according to the depth of the cut groove 300, that is, the thickness of the wafer 1. As illustrated in FIG. 6, the wafer 1 resulting from the preset number of times of repetition of the etching step and the film depositing step in the plasma etching step ST3 has the entire undersurface 7 etched in the first etching step, and is consequently thinned by the amount of a thickness 101. In addition, as illustrated in FIG. 6, the wafer 1 resulting from the preset number of times of repetition of the etching step and the film depositing step has the groove bottom of the second cut groove 302 etched in the etching step, so that the second cut groove 302 has reached the functional layer 4. The substrate 2 is divided by the cut groove 300, the functional layer 4 is exposed within the second cut groove 302, and the functional layer 4 remains at the groove bottom of the cut groove 300. After ending the plasma etching step ST3, the wafer processing method proceeds to the laser processing step ST4.

(Laser Processing Step)

Figure 7:
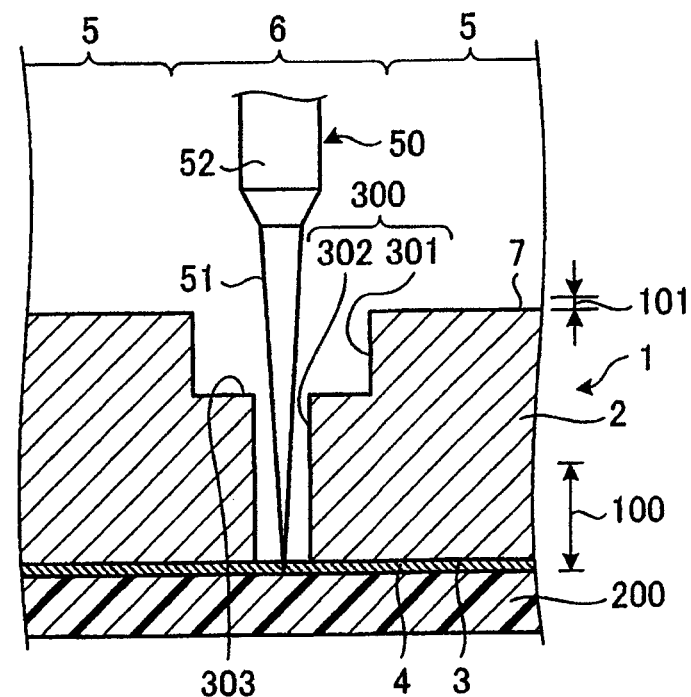
FIG. 7 is a sectional view illustrating a laser processing step of the wafer processing method illustrated in FIG. 2.

FIG. 7 is a sectional view illustrating the laser processing step of the wafer processing method illustrated in FIG. 2.

Figure 8:
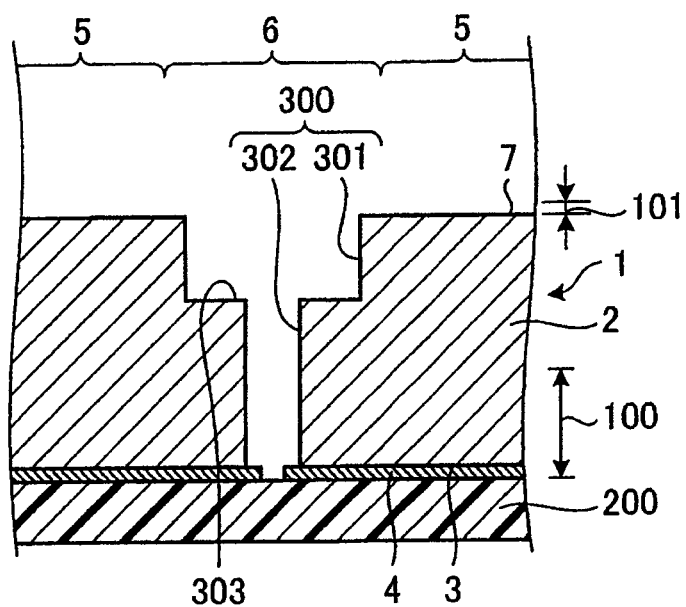
FIG. 8 is a sectional view of a part of the wafer after the laser processing step of the wafer processing method illustrated in FIG. 2.

FIG. 8 is a sectional view of a part of the wafer after the laser processing step of the wafer processing method illustrated in FIG. 2.

The laser processing step ST4 is a step in which a laser processing apparatus 50 illustrated in FIG. 7 removes the functional layer 4 along the cut groove 300 by irradiating the functional layer 4 remaining at the groove bottom of the cut groove 300 dividing the substrate 2 with a laser beam 51 of a wavelength absorbable by the functional layer 4 (wavelength absorbed by the functional layer 4) after the plasma etching step ST3 is carried out.

In the laser processing step ST4, the laser processing apparatus 50 holds the functional layer 4 side of the wafer 1 on a chuck table via the adhesive tape 200, and irradiates the functional layer 4 exposed at the groove bottom of the cut groove 300 with the laser beam 51 of a wavelength absorbable by the functional layer 4 (for example, 355 nm) from a laser beam irradiating unit 52 while moving the laser beam irradiating unit 52 and the chuck table relative to each other along the streets 6, as illustrated in FIG. 7. In the laser processing step ST4, the functional layer 4 exposed at the groove bottom of the cut groove 300 is divided by subjecting the functional layer 4 exposed at the groove bottom of the cut groove 300 to ablation processing in each of the streets 6, so that the wafer 1 is divided into device chips including individual devices 5. Incidentally, in the laser processing step ST4, the metallic film or the TEG (not illustrated) formed in the streets 6 is also divided. After dividing the functional layer 4 exposed at the groove bottom of the cut groove 300 in all of the streets 6 as illustrated in FIG. 8, the wafer processing method proceeds to the finish grinding step ST5.

(Finish Grinding Step)

Figure 9:
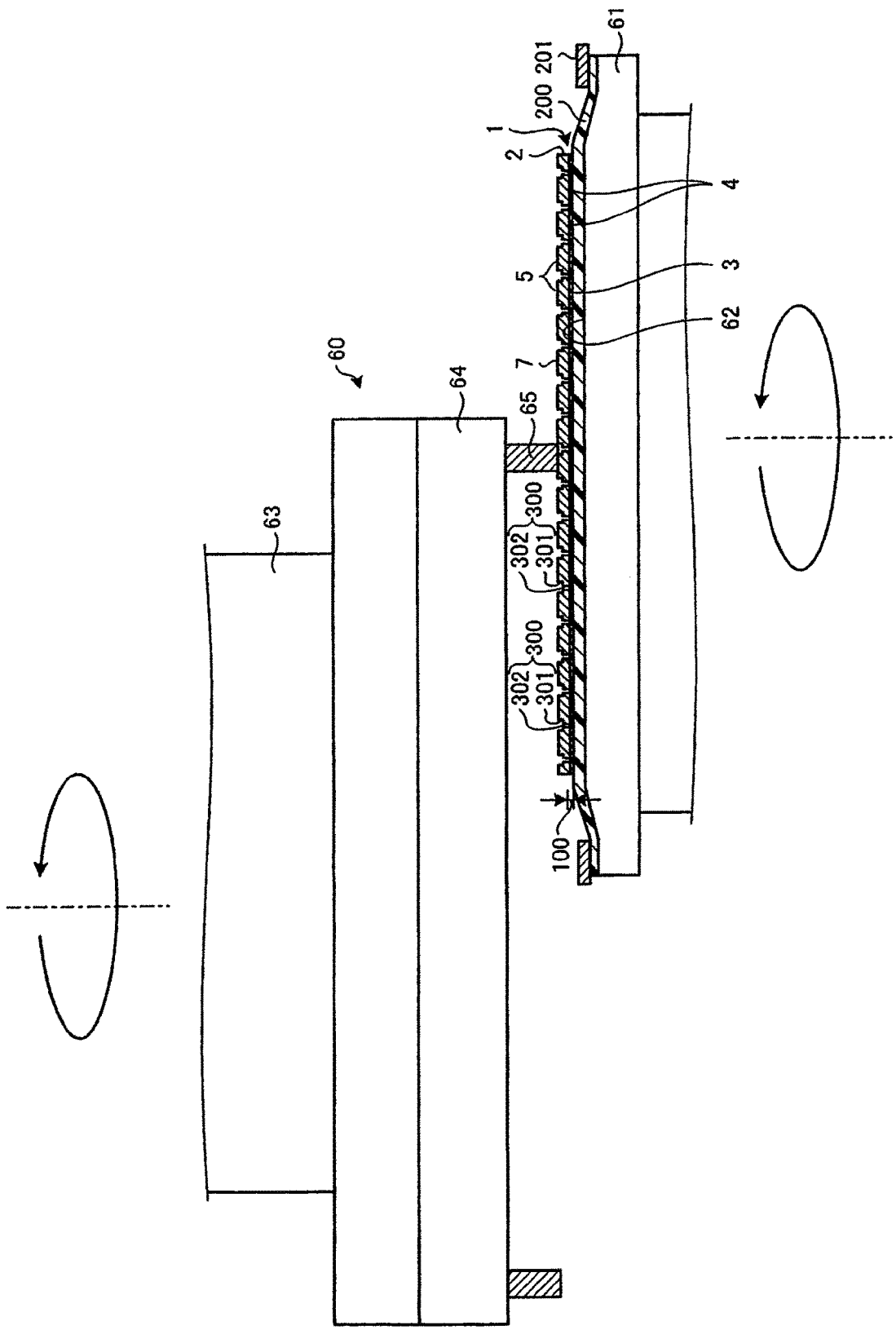
FIG. 9 is a sectional side view illustrating a finish grinding step of the wafer processing method illustrated in FIG. 2.

FIG. 9 is a sectional side view illustrating the finish grinding step of the wafer processing method illustrated in FIG. 2. The finish grinding step ST5 is a step of reducing the thickness of the wafer 1 to the finished thickness 100 by grinding the undersurface 7 of the wafer 1 after the plasma etching step ST3 and the laser processing step ST4.

In the finish grinding step ST5, a grinding apparatus 60 sucks and holds the functional layer 4 side of the wafer 1 on a holding surface 62 of a chuck table 61 via the adhesive tape 200. As illustrated in FIG. 9, in the finish grinding step ST5, grinding water is supplied while rotating a grinding wheel 64 for finish grinding by a spindle 63 and rotating the chuck table 61 about an axis thereof, and a grindstone 65 for finish grinding approaches to the chuck table 61 at a predetermined feed speed. The undersurface 7 of the wafer 1, that is, the device chips is thereby finish-ground by the grindstone 65 for finish grinding. In the finish grinding step ST5, the wafer 1, that is, the device chips are ground to the finished thickness 100. In the finish grinding step ST5, when the wafer 1, that is, the device chips are ground to the finished thickness 100, the first cut groove 301 is removed, and steps between the first cut groove 301 and the second cut groove 302 are removed. After thinning the wafer 1, that is, the device chips to the finished thickness 100, the wafer processing method proceeds to the die attachment film affixing step ST6.

(Die Attachment Film Affixing Step)

Figure 10:
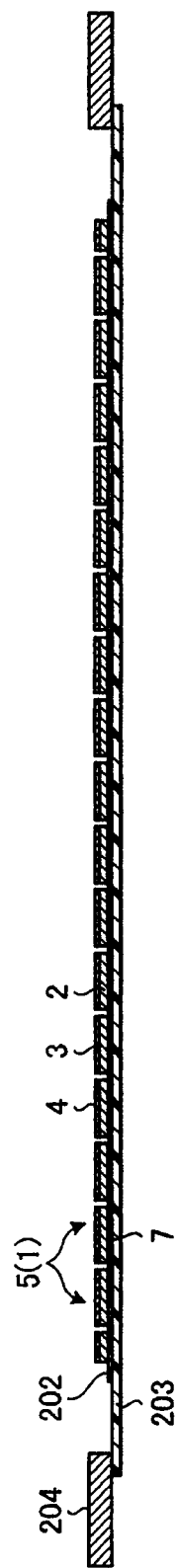
FIG. 10 is a sectional view of the wafer after a die attachment film affixing step of the wafer processing method illustrated in FIG. 2.

FIG. 10 is a sectional view of the wafer after the die attachment film affixing step of the wafer processing method illustrated in FIG. 2. The die attachment film affixing step ST6 is a step of affixing a die attachment film 202 to the undersurface 7 of the wafer 1 after the plasma etching step ST3, the laser processing step ST4, and the finish grinding step ST5.

In the die attachment film affixing step ST6, the die attachment film 202 for bonding the device chips is affixed to the undersurface 7 of the wafer 1, that is, the device chips finish-ground in the finish grinding step ST5. In the die attachment film affixing step ST6, as illustrated in FIG. 10, the die attachment film 202 laminated on a dicing tape 203 having an outer peripheral edge thereof to which an annular frame 204 is affixed is affixed to the undersurface 7 of the wafer 1, and the adhesive tape 200 is peeled off the functional layer 4. After peeling the adhesive tape 200 off the functional layer 4, the wafer processing method proceeds to the die attachment film dividing step ST7.

(Die Attachment Film Dividing Step)

Figure 11:
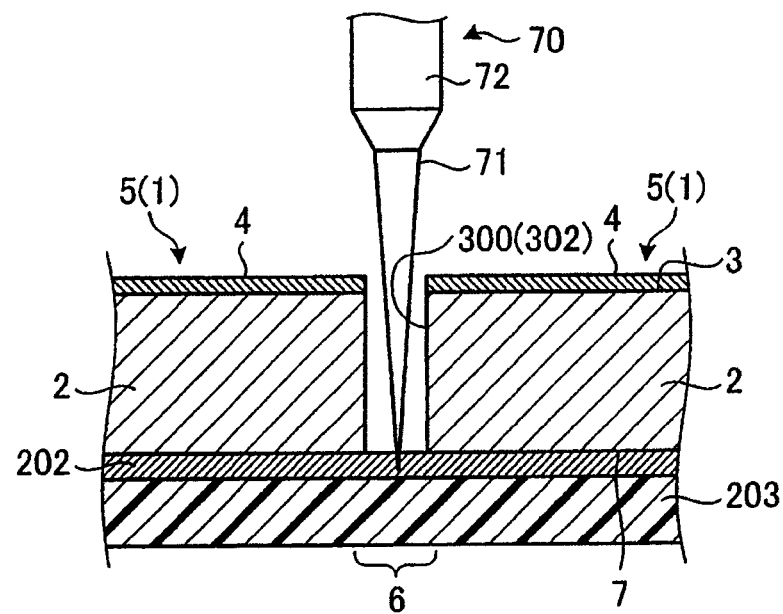
FIG. 11 is a sectional view illustrating a die attachment film dividing step of the wafer processing method illustrated in FIG. 2.
Figure 12:
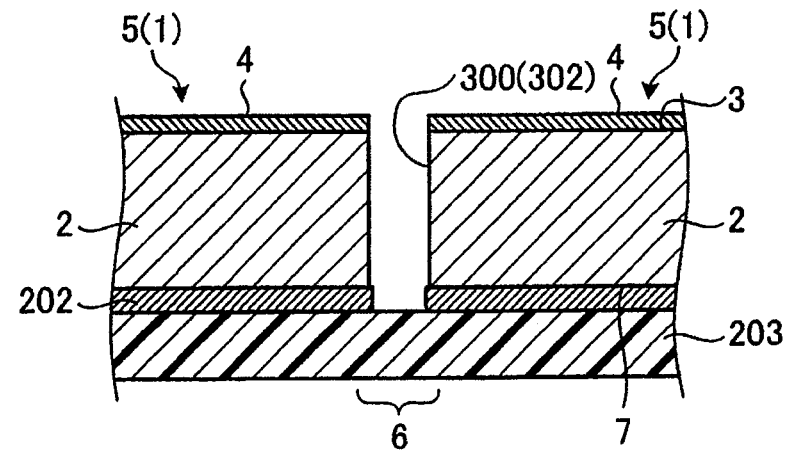
FIG. 12 is a sectional view of a part of the wafer after the die attachment film dividing step of the wafer processing method illustrated in FIG. 2.

FIG. 11 is a sectional view illustrating the die attachment film dividing step of the wafer processing method illustrated in FIG. 2. FIG. 12 is a sectional view of a part of the wafer after the die attachment film dividing step of the wafer processing method illustrated in FIG. 2. The die attachment film dividing step ST7 is a step in which a laser processing apparatus 70 illustrated in FIG. 11 divides the die attachment film 202 by irradiating the die attachment film 202 with a laser beam 71 along the cut groove 300.

In the die attachment film dividing step ST7, the laser processing apparatus 70 holds the undersurface 7 side of the wafer 1 on a chuck table via the dicing tape 203, and irradiates the die attachment film 202 exposed within the cut groove 300 with the laser beam 71 having a wavelength absorbable by the die attachment film 202 (for example, 355 nm) from a laser beam irradiating unit 72 while moving the laser beam irradiating unit 72 and the chuck table relative to each other along the streets 6, as illustrated in FIG. 11. In the die attachment film dividing step ST7, the die attachment film 202 exposed within the cut groove 300 is divided by subjecting the die attachment film 202 exposed within the cut groove 300 to ablation processing in each of the streets 6. The wafer processing method is ended when the die attachment film 202 exposed within the cut groove 300 is divided in all of the streets 6, as illustrated in FIG. 12. Incidentally, the device chips are thereafter picked up from the dicing tape 203 by a pickup not illustrated in the figure together with the die attachment film 202.

In the wafer processing method according to the first embodiment, the cut groove 300 is formed from the undersurface 7 along the streets 6 in the cutting step ST2, and thereafter the cut groove 300 is extended toward the top surface 3 of the substrate 2 and thus the wafer 1 is divided by performing plasma etching from the undersurface 7 side in the plasma etching step ST3. Plasma dicing that does not need a mask can therefore be realized. The wafer processing method thus obviates a need for an expensive mask in the method of processing the wafer 1 having the devices 5 that are suitable for division by plasma etching because the devices 5 are smaller than devices to be divided by cutting processing. As a result, in the wafer processing method, the wafer 1 can be divided into the device chips including the individual devices 5 by plasma-etching the wafer 1, while reducing cost.

In addition, in the wafer processing method, the adhesive tape 200 is affixed to the functional layer 4 side in the protective member disposing step ST1 before the cutting step ST2 and the finish grinding step ST5. It is therefore possible to suppress a contamination generating at the times of the cutting step ST2 and the finish grinding step ST5 from adhering to the devices 5.

In addition, in the wafer processing method, the functional layer 4 remaining at the groove bottom of the cut groove 300 is divided by irradiating the functional layer 4 with the laser beam 51 in the laser processing step ST4. Therefore, in the wafer processing method, the wafer 1 to which the functional layer 4 such as a Low-k film or the like is laminated can be divided into the device chips including the individual devices 5. In addition, in the wafer processing method, the adhesive tape 200 is affixed to the functional layer 4 side in the protective member disposing step ST1 before the laser processing step ST4, and the functional layer 4 at the groove bottom of the cut groove 300 is irradiated with the laser beam 51 from the undersurface 7 side in the laser processing step ST4. The wafer processing method can therefore suppress debris generating at the time of ablation processing from adhering to the devices 5.

In addition, in the wafer processing method, the second cut groove 302 narrower than the first cut groove 301 is formed at the groove bottom 303 of the first cut groove 301 after forming the first cut groove 301 in the cutting step ST2, and the wafer 1 is plasma-etched by the Bosch process in the plasma etching step ST3. Therefore, in the wafer processing method, plasma formed of the $SF_6$ gas can be drawn into the wafer 1 through the groove bottom of the second cut groove 302 in the etching step of the plasma etching step ST3. As a result, in the wafer processing method, the substrate 2 of the wafer 1 can efficiently be divided.

In addition, in the wafer processing method, the cut groove 300 deeper than the finished thickness 100 of the wafer 1 is formed in the cutting step ST2. Therefore, in the wafer processing method, steps at the finished thickness 100 or more can be provided on the undersurface 7 side, and the cut groove 300 having a desired depth is formed while the thickness of the wafer 1 left after the plasma etching step ST3 becomes the finished thickness.

In addition, in the wafer processing method, the substrate 2 is divided along the streets 6 in the plasma etching step ST3. Thus, side surfaces of the individually divided device chips are surfaces formed by plasma etching. Therefore, the wafer processing method also produces an effect of being able to manufacture device chips having a high transverse rupture strength without leaving chipping due to cutting processing on the side surfaces of the individually divided device chips.

In addition, in the wafer processing method, the undersurface 7 of the wafer 1 is ground and steps between the first cut groove 301 and the second cut groove 302 are removed in the finish grinding step ST5. Device chips having predetermined dimensions can therefore be obtained.

In addition, the wafer processing method includes the die attachment film affixing step ST6 and the die attachment film dividing step ST7. Device chips that can be fixed to a substrate or the like can therefore be obtained.

Second Embodiment

Figure 13:
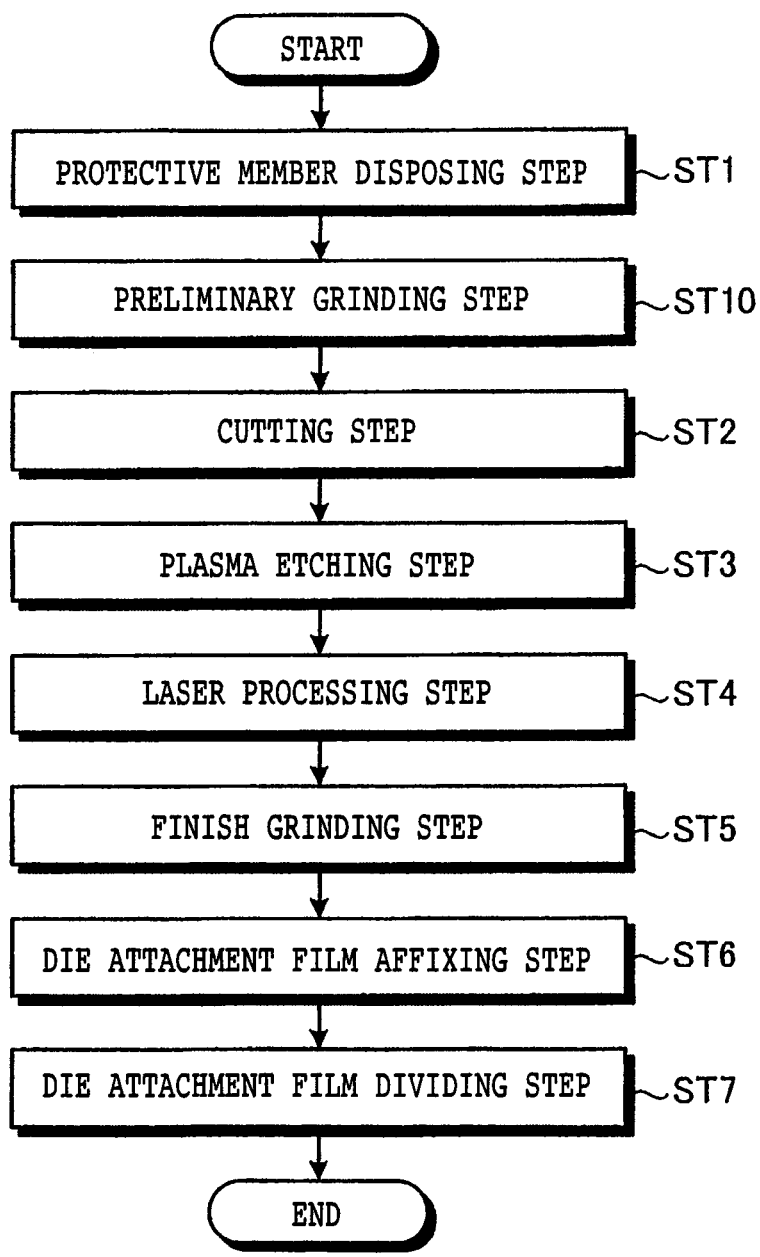
FIG. 13 is a flowchart illustrating a flow of a wafer processing method according to a second embodiment.
Figure 14:
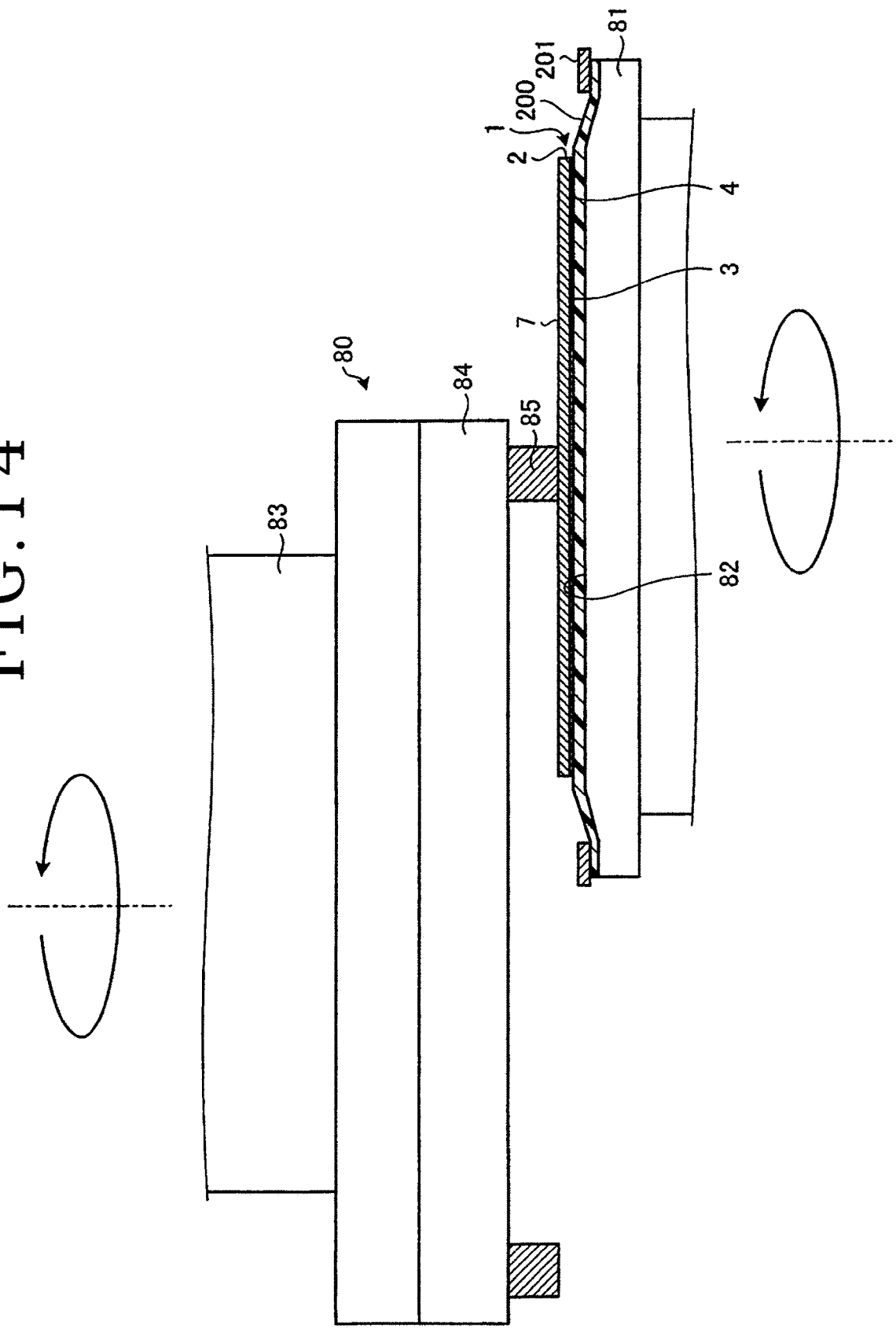
FIG. 14 is a sectional side view illustrating a preliminary grinding step of the wafer processing method illustrated in FIG. 13.
Figure 15:
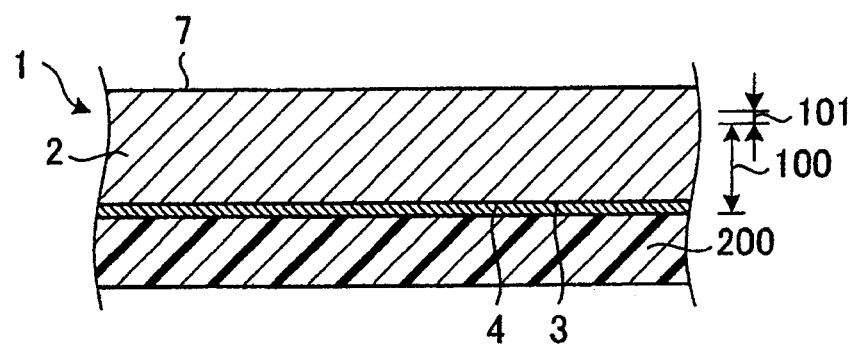
FIG. 15 is a sectional view of a part of a wafer after the preliminary grinding step of the wafer processing method illustrated in FIG. 13.

A wafer processing method according to a second embodiment of the present invention will be described with reference to the drawings. FIG. 13 is a flowchart illustrating a flow of the wafer processing method according to the second embodiment. FIG. 14 is a sectional side view illustrating a preliminary grinding step of the wafer processing method illustrated in FIG. 13. FIG. 15 is a sectional view of a part of a wafer after the preliminary grinding step of the wafer processing method illustrated in FIG. 13. Incidentally, in FIG. 13, FIG. 14, and FIG. 15, the same parts as in the first embodiment are identified by the same reference numerals, and description thereof will be omitted.

As illustrated in FIG. 13, the wafer processing method according to the second embodiment is the same as in the first embodiment except that the wafer processing method according to the second embodiment includes a preliminary grinding step ST10. The preliminary grinding step ST10 is a step of grinding the undersurface 7 of the wafer 1 in advance before the plasma etching step ST3. In the wafer processing method according to the second embodiment, the preliminary grinding step ST10 is performed after the protective member disposing step ST1 and before the cutting step ST2. However, in the present invention, the preliminary grinding step ST10 may be performed before the protective member disposing step ST1 or after the cutting step ST2 as long as the preliminary grinding step ST10 is performed before the plasma etching step ST3.

In the preliminary grinding step ST10, a grinding apparatus 80 sucks and holds the functional layer 4 side of the wafer 1 on a holding surface 82 of a chuck table 81 via the adhesive tape 200. As illustrated in FIG. 14, in the preliminary grinding step ST10, grinding water is supplied while rotating a grinding wheel 84 for rough grinding by a spindle 83 and rotating the chuck table 81 about an axis thereof, and a grindstone 85 for rough grinding approaches to the chuck table 81 at a predetermined feed speed. The undersurface 7 of the wafer 1 is thereby roughly ground by the grindstone 85 for rough grinding. Incidentally, the grindstone 85 for rough grinding is a grinding stone having abrasive grains larger than those of the grindstone 65 for finish grinding.

In the preliminary grinding step ST10, as illustrated in FIG. 15, the wafer 1 is ground until the thickness of the wafer 1 becomes equal to or more than a thickness obtained by adding together the finished thickness 100 and the thickness 101 to be removed in the plasma etching step ST3. In the second embodiment, the wafer processing method proceeds to the plasma etching step ST3 after grinding the wafer 1 until the thickness of the wafer 1 becomes equal to or more than the thickness obtained by adding together the finished thickness 100 and the thickness 101 to be removed in the plasma etching step ST3. Incidentally, in the preliminary grinding step ST10 of the present invention, the wafer 1 is desirably thinned to a thickness substantially equal to the thickness obtained by adding together the finished thickness 100 and the thickness 101 to be removed in the plasma etching step ST3.

In the wafer processing method according to the second embodiment, the cut groove 300 is formed from the undersurface 7 along the streets 6 in the cutting step ST2, and thereafter plasma etching is performed from the undersurface 7 side in the plasma etching step ST3. Plasma dicing that does not need a mask can therefore be realized. As a result, in the wafer processing method, as in the first embodiment, the wafer 1 can be divided into the device chips including the individual devices 5 by plasma-etching the wafer 1, while reducing cost.

In addition, in the wafer processing method according to the second embodiment, the wafer 1 is thinned by performing the preliminary grinding step ST10 before the plasma etching step ST3. It is therefore possible to reduce an amount of removal of the substrate 2 of the wafer 1 at the time of the plasma etching step ST3. As a result, in the wafer processing method according to the second embodiment, an amount of so-called outgas generating in the plasma etching step ST3 can be reduced.

In addition, in the wafer processing method according to the second embodiment, the undersurface 7 of the wafer 1 is ground by performing the preliminary grinding step ST10 before the cutting step ST2. Thus, even when the undersurface 7 of the wafer 1 is a pear-skin surface (surface having fine projections and depressions) before the preliminary grinding step ST10, the undersurface 7 can be flattened before the cutting step ST2. As a result, the wafer processing method according to the second embodiment can suppress a positional displacement between the cutting blades 12-1 and 12-2 and the streets 6 when alignment is carried out on the basis of an image imaged by the infrared camera in the cutting step ST2.

Third Embodiment

Figure 16:
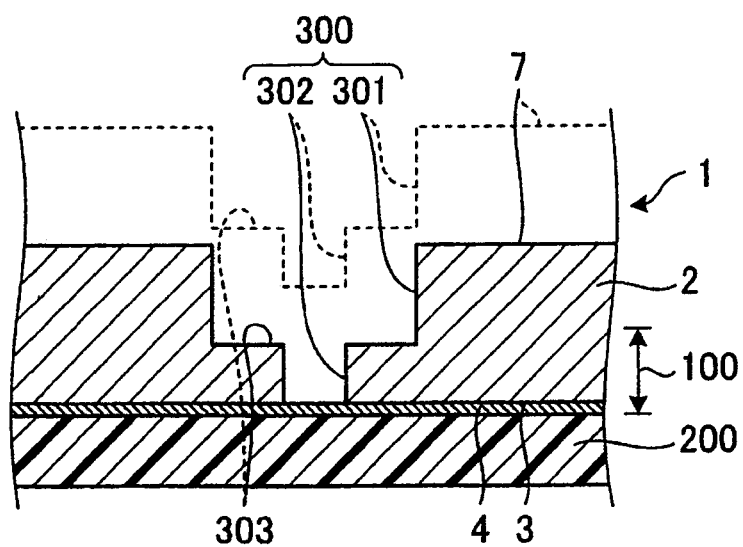
FIG. 16 is a sectional view of a part of a wafer after a plasma etching step of a wafer processing method according to a third embodiment.

A wafer processing method according to a third embodiment of the present invention will be described with reference to the drawings. FIG. 16 is a sectional view of a part of a wafer after a plasma etching step of the wafer processing method according to the third embodiment. Incidentally, in FIG. 16, the same parts as in the first embodiment are identified by the same reference numerals, and description thereof will be omitted.

The wafer processing method according to the third embodiment is the same as in the first embodiment except etching the wafer 1 by anisotropic etching in place of the Bosch process in the plasma etching step ST3. In the plasma etching step ST3 of the wafer processing method according to the third embodiment, the whole of the substrate 2 is etched from the undersurface 7 side, and the substrate 2 is divided along the streets 6, as indicated by a solid line in FIG. 16, in a state in which the shape of the undersurface 7 and the cut groove 300 of the wafer 1 before etching, the shape being indicated by a dotted line in FIG. 16, is maintained.

In the wafer processing method according to the third embodiment, the cut groove 300 is formed from the undersurface 7 along the streets 6 in the cutting step ST2, and thereafter plasma etching is performed from the undersurface 7 side in the plasma etching step ST3. Plasma dicing that does not need a mask can therefore be realized. As a result, in the wafer processing method, as in the first embodiment, the wafer 1 can be divided into the device chips including the individual devices 5 by plasma-etching the wafer 1, while reducing cost.

In addition, in the wafer processing method according to the third embodiment, the substrate 2 of the wafer 1 is etched from the undersurface 7 side by anisotropic etching in the plasma etching step ST3. The substrate 2 of the wafer 1 can therefore be made thinner than in the case of etching by the Bosch process. As a result, in the method of processing the wafer 1, an amount of grinding of the substrate 2 in the finish grinding step ST5 can be reduced.

Incidentally, the wafer processing method according to the third embodiment may perform the preliminary grinding step ST10 as in the second embodiment.

It is to be noted that the present invention is not limited to the foregoing embodiments. That is, the present invention can be modified and carried out in various manners without departing from the gist of the present invention. For example, in the present invention, the functional layer 4, the metallic film, and the TEG formed in the streets 6 may be removed by ablation by applying a laser beam from the top surface before the cutting step ST2. In addition, in the present invention, an oxygen gas for etching the functional layer 4 formed of a resin may be mixed in the plasma etching gas in the plasma etching step ST3. In this case, the functional layer 4 remaining at the groove bottom of the cut groove 300 can be removed without the laser processing step ST4 being performed. Alternatively, in the present invention, the functional layer 4 may partly be removed by an oxygen gas, and the functional layer 4 is teared off and divided with the partly removed part as a fracture starting point by applying a radially expanding external force (specifically by expanding the adhesive tape 200).

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer having streets demarcating a plurality of devices, the wafer processing method comprising:
   a step of providing a substrate having a first surface and an opposing second surface, and a functional layer laminated to the first surface;
   a disposing step of disposing a protective member on the functional layer on the first surface of the substrate;
   a cutting step of forming, along the streets, a cut groove having a depth exceeding a finished thickness of the wafer by making a cutting blade cut into the second surface of the substrate; and
   a plasma etching step of extending the cut groove from a bottom surface of the cut groove to the functional layer on the first surface of the substrate to divide the substrate along the streets without dividing the functional layer, wherein in the plasma etching step, plasma etches the second surface in addition to the bottom surface of the cut groove.

2. The wafer processing method according to claim 1, further comprising a laser processing step of removing the functional layer along the cut groove by irradiating the functional layer remaining at a groove bottom of the cut groove and dividing the substrate with a laser beam having a wavelength absorbable by the functional layer after performing the plasma etching step.

3. The wafer processing method according to claim 1, wherein in the cutting step, after forming a first cut groove in the second surface of the substrate, further comprises forming a second cut groove narrower than the first cut groove at a groove bottom of the first cut groove to facilitate entry of a plasma etching gas into the cut groove in the plasma etching step.

4. The wafer processing method according to claim 1, further comprising a finish grinding step of reducing the wafer thickness to the finished thickness by grinding the second surface of the substrate after the plasma etching step.

5. The wafer processing method according to claim 1, further comprising a preliminary grinding step of grinding the second surface of the substrate before the plasma etching step.

6. The wafer processing method according to claim 1, further comprising:
   a die attachment film affixing step of affixing a die attachment film to the second surface of the wafer after the plasma etching step; and
   a die attachment film dividing step of dividing the die attachment film by irradiating the die attachment film with a laser beam along the cut groove.

7. The wafer processing method according to claim 2, wherein in the cutting step, after forming a first cut groove in the second surface of the substrate, further comprises forming a second cut groove narrower than the first cut groove at the groove bottom of the first cut groove to facilitate entry of a plasma etching gas into the cut groove in the plasma etching step.

8. The wafer processing method according to claim 2, further comprising a finish grinding step of reducing the wafer thickness to the finished thickness by grinding the second surface of the substrate after the plasma etching step.

9. The wafer processing method according to claim 2, further comprising a preliminary grinding step of grinding the second surface of the substrate before the plasma etching step.

10. The wafer processing method according to claim 2, further comprising:
- an affixing step of affixing a die attachment film to the second surface of the substrate after the plasma etching step; and
- a dividing step of dividing the die attachment film by irradiating the die attachment film with a laser beam along the cut groove.

11. The wafer processing method according to claim 1, wherein the plasma etching step includes using anisotropic etching to extend the cut groove to the functional layer on the first surface of the substrate.

12. The wafer processing method according to claim 1, wherein the cutting step includes using a dicer having two cutting units configured to form the cut groove in the substrate.

13. The wafer processing method according to claim 3, wherein the cutting step includes using a dicer having two cutting units configured to form the cut groove in the substrate.

\* \* \* \* \*